United States Patent
Dubowski et al.

(10) Patent No.: US 10,424,921 B2
(45) Date of Patent: Sep. 24, 2019

(54) DIE-TO-DIE INTERFACE CONFIGURATION AND METHODS OF USE THEREOF

(71) Applicant: QUALCOMM INCORPORATED, San Diego, CA (US)

(72) Inventors: Kenneth Dubowski, San Diego, CA (US); Luverne Ray Peterson, San Diego, CA (US); Thomas Bryan, Carlsbad, CA (US); Stephen Knol, San Diego, CA (US); Sreeker Dundigal, San Diego, CA (US); Alvin Loke, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 289 days.

(21) Appl. No.: 15/434,285

(22) Filed: Feb. 16, 2017

(65) Prior Publication Data

US 2018/0233907 A1    Aug. 16, 2018

(51) Int. Cl.
*H02H 9/04* (2006.01)
*H01L 23/00* (2006.01)
(Continued)

(52) U.S. Cl.
CPC ........... *H02H 9/046* (2013.01); *H01L 23/485* (2013.01); *H01L 23/50* (2013.01); *H01L 24/06* (2013.01); *H01L 24/08* (2013.01); *H01L 25/0655* (2013.01); *H01L 27/0296* (2013.01); *H03K 19/017509* (2013.01); *H01L 2224/06134* (2013.01); *H01L 2224/08135* (2013.01)

(58) Field of Classification Search
CPC ....... H02H 9/046; H01L 23/485; H01L 23/50; H01L 24/06; H01L 24/08
See application file for complete search history.

(56) References Cited

U.S. PATENT DOCUMENTS 5,359,496 A   10/1994   Kornrumpf et al.
6,078,514 A   6/2000   Takemae et al.
(Continued)

FOREIGN PATENT DOCUMENTS

DE   10108077 A1   9/2002
EP   1179740 A2   2/2002
(Continued)

OTHER PUBLICATIONS

Partial International Search Report—PCT/US2018/016730—ISA/EPO—dated May 2, 2018.
(Continued)

*Primary Examiner* — Scott Bauer
(74) *Attorney, Agent, or Firm* — Haynes and Boone, LLP

(57) ABSTRACT

A semiconductor die including: a die-to-die interface including an input/output (I/O) circuitry area and an electrical contact area; wherein the electrical contact area includes an array of electrical contacts disposed on a side of the semiconductor die; and wherein the I/O circuitry area includes a plurality of drivers, each of the drivers coupled to at least one electrical contact in the electrical contact area, and a plurality of electrostatic discharge (ESD) protection devices, each of the ESD protection devices coupled to a respective driver, further wherein the I/O circuitry area and the electrical contact area are separated in a top-down view of the semiconductor die.

25 Claims, 6 Drawing Sheets

(51) Int. Cl.
 *H01L 27/02* (2006.01)
 *H01L 23/485* (2006.01)
 *H01L 23/50* (2006.01)
 *H01L 25/065* (2006.01)
 *H03K 19/0175* (2006.01)

(56) References Cited

U.S. PATENT DOCUMENTS

| | | |
|---|---|---|
| 6,445,065 B1 | 9/2002 | Gheewala et al. |
| 6,466,008 B1 | 10/2002 | Fung et al. |
| 6,563,340 B1 | 5/2003 | Jones |
| 8,396,682 B2 | 3/2013 | Oh et al. |
| 8,418,115 B1 | 4/2013 | Tom et al. |
| 8,503,261 B2 | 8/2013 | Riho |
| 8,719,753 B1 | 5/2014 | Chow et al. |
| 8,799,730 B2 | 8/2014 | Oh et al. |
| 9,245,870 B1 | 1/2016 | Peterson et al. |
| 9,459,318 B2 | 10/2016 | Lee et al. |
| 2002/0118563 A1 | 8/2002 | Keeth et al. |
| 2004/0056367 A1 | 3/2004 | Jassowski |
| 2004/0098694 A1 | 5/2004 | Teig et al. |
| 2004/0188818 A1 | 9/2004 | Wang |
| 2007/0182601 A1 | 8/2007 | Ueno |
| 2009/0327539 A1 | 12/2009 | Kanerva et al. |
| 2010/0091537 A1* | 4/2010 | Best .................. G11C 5/02 365/51 |
| 2012/0106117 A1 | 5/2012 | Sundaram et al. |
| 2013/0009324 A1 | 1/2013 | Bartley et al. |
| 2013/0015586 A1 | 1/2013 | Crisp et al. |
| 2013/0318266 A1 | 11/2013 | Thomas et al. |
| 2014/0111243 A1 | 4/2014 | Kumar et al. |

FOREIGN PATENT DOCUMENTS

| | | |
|---|---|---|
| WO | WO-2008076790 A2 | 6/2008 |
| WO | WO-2011097630 A2 | 8/2011 |
| WO | WO-2016060780 A1 | 4/2016 |

OTHER PUBLICATIONS

International Search Report and Written Opinion—PCT/US2018/016730—ISA/EPO—dated Jul. 20, 2018.

* cited by examiner

DIE-TO-DIE INTERFACE CONFIGURATION AND METHODS OF USE THEREOF

TECHNICAL FIELD

This application relates to die-to-die interfaces and, more particularly, to die-to-die interfaces having component arrangement for improving area use.

BACKGROUND

Packaged systems incorporating multiple semiconductor die are receiving growing interest. Multi-die packages use die-to-die links to enable communication between die. A die-to-die link must typically support very large aggregate data bandwidth and favors a forwarded-clock parallel bus architecture given the connectivity density enabled by new advanced package technologies.

Some conventional systems include an architecture in which each die has a number of externally-exposed contacts (e.g., vias) that are used for data contacts. At least one other externally-exposed contact on each die would be used for a clock signal. Each of the data contacts is associated with some kind of sequential logic circuit, for example, a flip flop that either captures transmitted data or transmits stored data. On a transmit side, the clock is provided at the externally-exposed clock node and then transferred die-to-die to a receive-side clock node on the other die.

Such conventional architecture may include placing flip-flops directly underneath or in the very near vicinity of their respective contacts. The flip-flops are then clocked by a clock tree at each die. The externally-exposed contacts are arranged in an array that may cover a relatively large surface area of each die. Thus, the clock trees may be relatively large because they each distribute the clock over an area consistent with the size of its respective array of contacts. In other words, in such prior art systems, the sequential logic circuits are not localized, but are rather distributed over the area of the array of contacts.

However, the clock trees in systems including distributed flip-flops may require using longer metal traces for some bits, thereby increasing the total amount of metal and capacitance, hence power consumption, in the clock tree as a whole. Furthermore, placing the flip-flops, drivers, and electrostatic discharge (ESD) circuitry underneath or in the very near vicinity of the respective contacts may be an inefficient use of space in some applications. There is thus a need in the art for improved die-to-die interfaces.

SUMMARY

Circuits for die-to-die interfaces are provided. Various embodiments separate the input output (I/O) and ESD circuitry from the contacts of the die, thereby freeing up the space underneath the contacts or in the very near vicinity of the contacts for use by other circuitry.

According to one embodiment, a semiconductor die includes: a die-to-die interface including an input/output (I/O) circuitry area and an electrical contact area; wherein the electrical contact area includes an array of electrical contacts disposed on a side of the semiconductor die; and wherein the I/O circuitry area includes a plurality of drivers, each of the drivers coupled to at least one electrical contact in the electrical contact area, and a plurality of electrostatic discharge (ESD) protection devices, each of the ESD protection devices coupled to a respective driver, further wherein the I/O circuitry area and the electrical contact area are separated in a top-down view of the semiconductor die.

According to an embodiment, a multi-chip system includes: a first semiconductor die having a first array of electrical contacts; and a second semiconductor die having a second array of electrical contacts, wherein a given electrical contact of the first array is coupled to a respective electrical contact of the second array; wherein the first semiconductor die further includes: a plurality of data drivers and a plurality of electrostatic discharge (ESD) protection devices, wherein each of the data drivers is coupled to a respective one of the ESD protection devices, further wherein each of the ESD protection devices is coupled to a respective one of the electrical contacts of the first array, wherein in a top-down arrangement of the first semiconductor die, the plurality of data drivers and the plurality of ESD protection devices are disposed within a first area of the semiconductor die and the first array of electrical contacts is disposed within a second area of the semiconductor die, the first area and second area being laterally separated in the top-down arrangement.

According to an embodiment, a semiconductor die includes: die-to-die interface including an input/output (I/O) circuitry area and an electrical contact area; wherein the electrical contact area includes an array of electrical contacts disposed on a side of the semiconductor die; and wherein the I/O circuitry area includes a plurality of means for driving data bits, each of the driving means being coupled to at least one electrical contact in the electrical contact area, and a plurality of means for protecting against electrostatic discharge (ESD), each of the means for protecting against ESD being coupled to a respective driving means, further wherein the I/O circuitry area and the electrical contact area are separated in a top-down view of the semiconductor die.

According to another embodiment, a method includes: providing data bits from a plurality of electrical contacts on a first die to a plurality of electrical contacts on a second die, wherein individual ones of the plurality of electrical contacts on the first die correspond to respective ones of the electrical contacts on the second die, wherein the electrical contacts are disposed within a first area of a surface of the first die; for each one of the data bits: receiving a clock signal at a sequential logic circuit of a first plurality of sequential logic circuits arranged within a second area of the first die, wherein the second area is physically separate from the first area in a top-down view of the first die; in response to receiving the clock signal at the sequential logic circuit, transmitting a respective bit of the data from the sequential logic circuit along a physical route on the first die to a respective one of the electrical contacts on the first die by way of a data driver and an electrostatic discharge (ESD) protection circuit within the second area, along a die-to-die channel to a respective one of the electrical contacts on the second die, and from the respective one of the electrical contacts on the second die to a sequential logic circuit of a second plurality of sequential logic circuits on the second die; and capturing the respective bit of the data by the sequential logic circuit of the second plurality of sequential logic circuits in response to receiving the clock signal.

DETAILED DESCRIPTION

Example Circuit Embodiments

Figure 1:
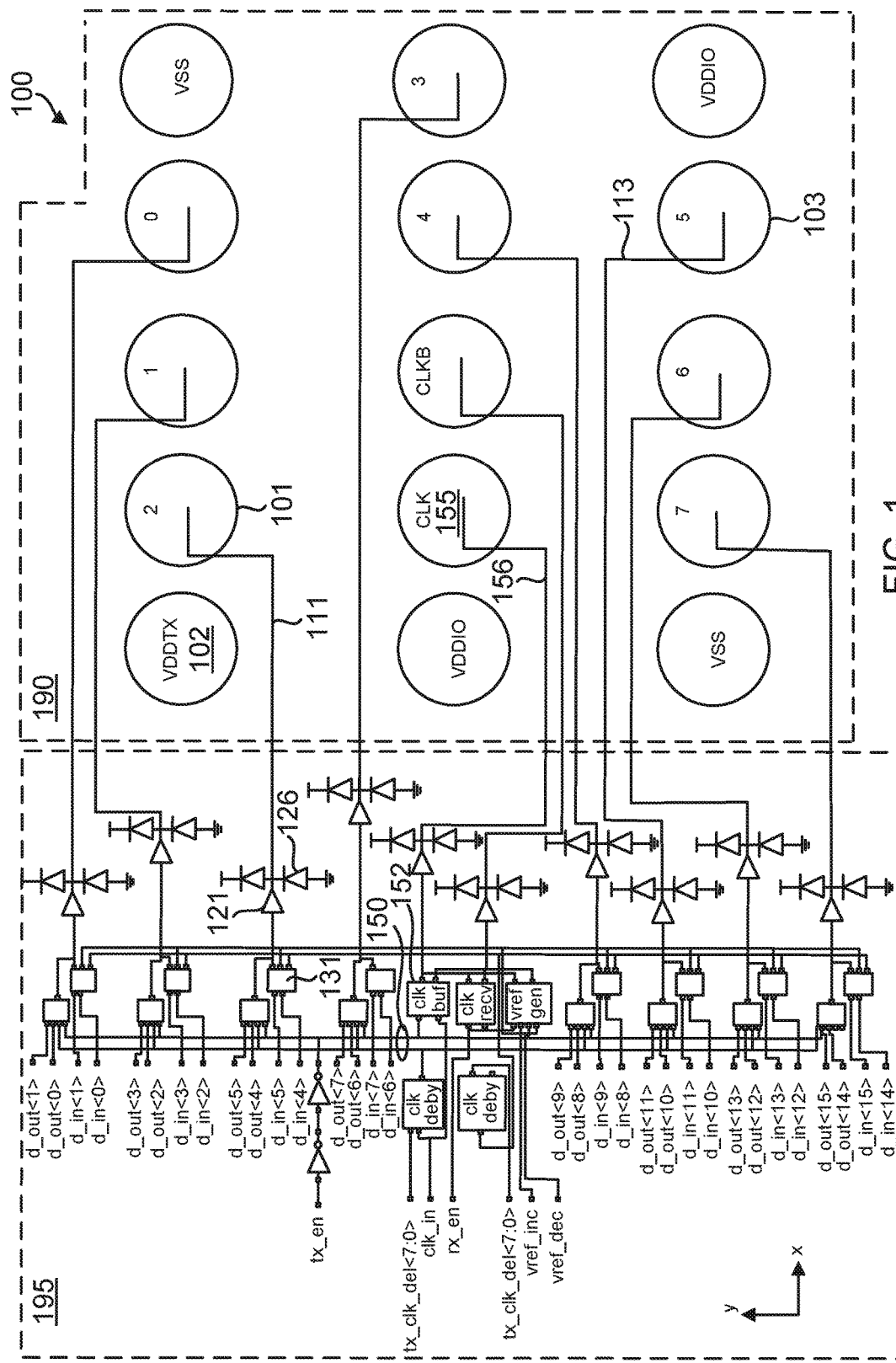
FIG. 1 is an illustration showing a first die having a circuit layout according to one embodiment

Various embodiments make more efficient use of die space by adopting a new arrangement for input output (I/O) circuitry, electrostatic discharge (ESD) protection devices, and contact area on the surface of the die. For example, in one embodiment, a die-to-die interface has an I/O circuitry area and an electrical contact area, when viewed from a top-down vantage point. The electrical contact area includes an array of electrical contacts (e.g., vias) that are exposed on a side (e.g., the top surface) of the die. In the top-down arrangement, the I/O circuitry area includes the I/O circuitry itself and the ESD protection devices. Continuing with the example, the I/O circuitry area and the electrical contact area are physically separate and do not overlap, so that in the top-down view the I/O circuitry is physically separate from the electrical contacts.

In the example embodiment above, the clock tree is included within the I/O circuitry area, as are data registers. The clock tree feeds the data registers and the I/O circuitry. Since the clock tree is confined to the I/O circuitry area, it can be implemented relatively small when compared to a clock tree that would feed circuitry under the contacts.

Further embodiments may reduce the number of contacts on the die-to-die interface by implementing serializers on the transmit side and deserializers on the receive side. On the transmit side, the serializers receive multiple bits in parallel and shift them out serially at a higher clock rate, so that a given contact may serve what would otherwise be multiple parallel bits. On the transmit side, deserializers receive the serial bits and output them as parallel bits. This is in contrast to a system that associates each contact with a single bit of data. However, the scope of embodiments is not limited to serializing output bits.

Various embodiments may include advantages over conventional systems. For instance, some embodiments may implement a relatively compact clock tree in the I/O circuitry area, thereby decreasing metal in the clock tree, and as a result decreasing a parasitic capacitance of the clock tree. Similarly, moving the I/O circuitry and ESD protection devices out from under the electrical contacts frees up area under the contacts for use by other circuitry, such as central processing unit (CPU) or digital signal processor (DSP) circuitry.

In order to reduce metal and capacitance of the clock trees, while still providing adequate setup and hold times, various embodiments provide an architecture wherein sequential logic circuits for data bits are placed along one side of the die-to-die interface sub-system in one die and fed by the clock tree of that die. Another die-to-die interface sub-system in the other die of the multi-die package has its sequential logic circuits for the data bits placed along one side as well, but it is a different side than on the first die. In one example, each of the different die in the multi-die package have a same spatial arrangement of electrical contacts on the two die, where the electrical contacts are coupled with the sequential logic circuits. Physical data paths for each bit can be arranged so that the various bits each experience a similar delay for the sequential logic circuits of one die to the sequential logic circuits of the other die.

In one example, a multi-die package includes at least two die. The first die and the second die share a physical layout of their electrical contacts so that the first die includes an array of electrical contacts exposed on a surface of the die, and the second die also includes an array of electrical contacts exposed on its surface. A given electrical contact on the first die corresponds to a particular electrical contact on the second die, and those two electrical contacts that correspond to each other are similarly spatially placed within their arrays. Moreover, those two electrical contacts corresponds to either a same bit of data (wherein the bits are transmitted in parallel) or same group of bits of data (wherein the bits are transmitted serially). Put another way, in this example, the array of electrical contacts on the first die is arranged as if the array of electrical contacts on the second die had been spatially translated from the second die to the first die.

Each of the electrical contacts is served by a data input and sequential logic (e.g., a register), so that each electrical contact corresponds to a bit of a group of bits. The first die disposes data inputs and sequential logic circuits for each of the bits on a first side of a die-to-die subsystem of the first die, and the second die disposes data outputs and sequential logic circuits for each of the bits on a second side of a die-to-die subsystem of the second die, the first and second sides being different (for example, right versus left).

In another aspect, a data path for each data bit extends from a respective first register over a first conductor to a respective first contact on the first die and from a respective second contact on the second die over a second conductor to a respective second register, where the sum of the lengths of the first conductor and the second conductor is the same for each of the data bits. Another part of the data path for a given bit is a die-to-die data channel, which conducts the data bit from the electrical contact on the first die to a corresponding electrical contact on the second die. The die-to-die data channels for each of the bits are the same, or substantially the same, length.

Therefore, a given data bit may experience a short on-die route from its register to its electrical contact on the first die, and that short route is compensated by a long route on the second die, where the route on the second die includes a distance from the electrical contact to the corresponding register. Similarly another data bit may experience a long on-die route on the first die, which is compensated by a short on-die route on the second die. Nevertheless, the data bits have approximately the same sum of a first die data route length and a second die data route length, thereby providing substantially similar data routes for each of the bits at the die-to-die interface.

Further in this example, a clock signal is transmitted from the first die to the second die. The clock signal traverses a route that is similar in length to that of each of the data bits.

Various embodiments provide one or more advantages over conventional solutions. For instance, a clock tree on a die may be designed to be relatively small, since it feeds registers on one side of the die-to-die subsystem. By contrast, some conventional systems use clock trees which distribute the clock over an area defined by the array of electrical contacts.

Figure 2:
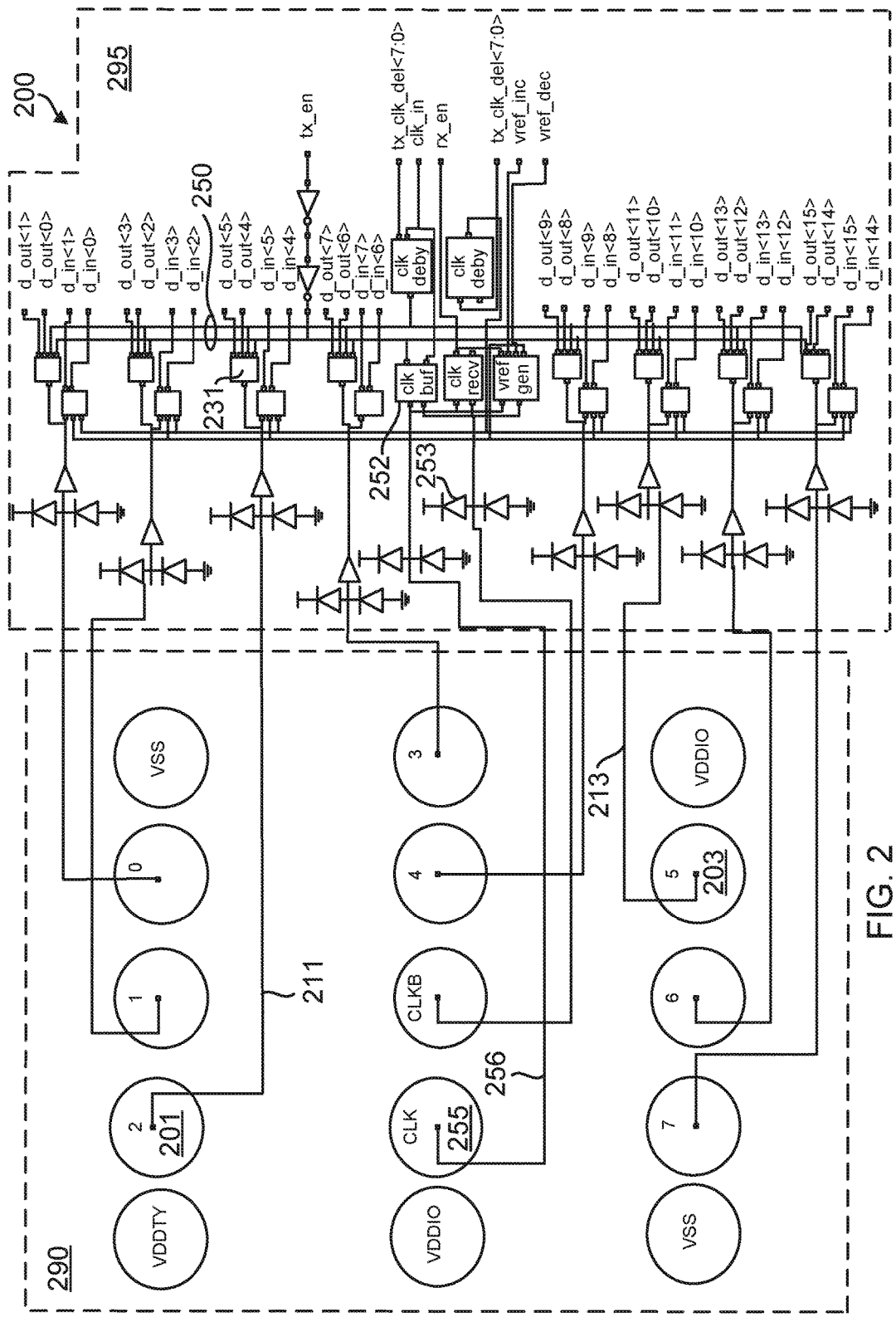
FIG. 2 is an illustration showing a second die having a circuit layout, according to one embodiment.
Figure 4:
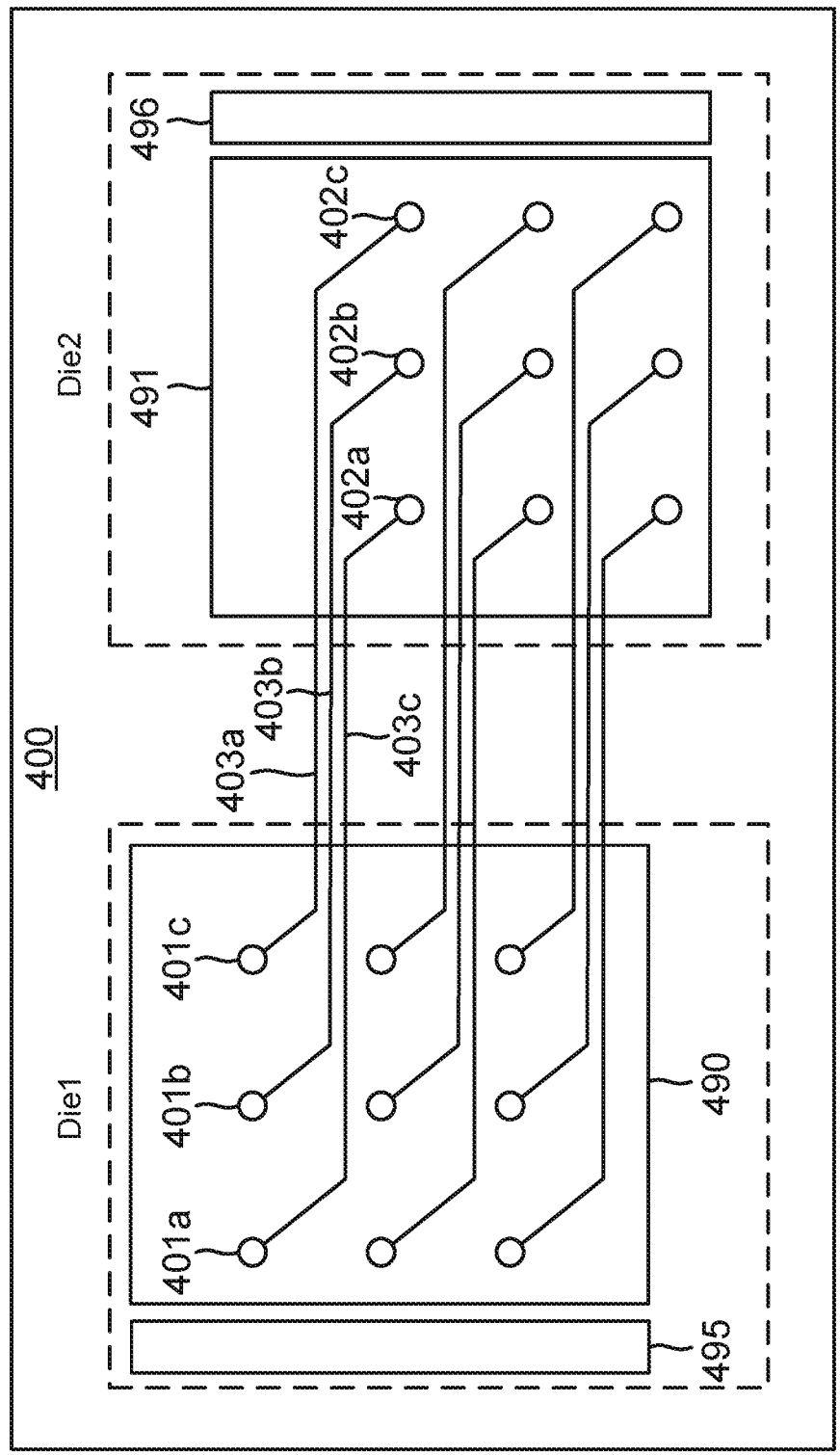
FIG. 4 is an illustration of an example multi-chip system, adapted according to one embodiment.

FIG. 1 is an illustration showing a first die-to-die interface sub-system 100 in one die having an array of electrical contacts thereon in a first area 190 and having I/O circuitry and ESD circuitry arranged in a second area 195, according to one embodiment. FIG. 2 is an illustration showing a second die-to-die interface sub-system 200 in one die having an array of electrical contacts thereon in a first area 290 and having I/O circuitry arranged in a second area 295, according to this embodiment. The two die corresponding to FIGS. 1 and 2 may be arranged in a multi-die package in some embodiments. For convenience, first die-to-die subsystem 100 and second die-to-die subsystem 200 are shown separately in different figures, but it is understood that first die-to-die subsystem 100 illustrates a transmit-side embodiment, and second die-to-die subsystem 200 illustrates a receive-side embodiment, where the two die-to-die subsystems 100 and 200 could be connected at a die-to-die interface in a multi-die package. An example multi-die package is shown at FIG. 4, as described below.

Focusing on FIG. 1, die-to-die subsystem 100 includes eight electrical contacts for data, each one of the electrical contacts corresponding to two bits of parallel data. Electrical contact 101 is one example electrical contact out of the eight electrical contacts shown on die-to-die subsystem 100. In this embodiment, electrical contact 101 includes an externally-exposed conductor (e.g., a via) on a surface of the die that includes die-to-die subsystem 100, where the externally-exposed conductor is represented by a circle. Electrical contact 101 is associated with ESD circuitry 126, represented here by two diodes. Not all of the electrical contacts of die-to-die subsystem 100 are associated with data, as illustrated by example contact 102, which is a power contact labeled VDDTX, and other power contacts are labeled some variation of VSS or VDD.

Another example electrical contact is contact 103. Each of the electrical contacts for data of this example corresponds to two bits of data of the 16 bits (<0:15>). So for example, electrical contact 101 is associated with data bit inputs d_in<4> and d_in<5>, and electrical contact 103 is associated with the data bit inputs d_in<10> and d_in<11>. Moving to FIG. 2, electrical contact 201 is associated with the same bits of data that electrical contact 101 is associated with, and is coupled to the data bit output d_out<4> and d_out<5>. Similarly, electrical contact 203 is associated with the same bits of data that electrical contact 103 is associated with, and is coupled to the data bit output d_out<10> and d_out<11>.

In this example, each of the electrical contacts in FIG. 1 is associated with two bits of data by virtue of its associated parallel output driver register. An example of a parallel output driver register includes register 131, which is associated with bits 4 and 5.

Die-to-die subsystem 100 and die-to-die subsystem 200 share a same arrangement of electrical contacts. As illustrated in FIGS. 1 and 2, electrical contact 101 is in the top left corner of die-to-die subsystem 100, and the logical contact 201 is that the top left of die-to-die subsystem 200. Electrical contacts 103 and 203 are spatially related in the same way. It is as if the arrangement of electrical contacts on die-to-die subsystem 100 was translated laterally to die-to-die subsystem 200, so that a given contact on die-to-die subsystem 100, having a first spatial relationship within the array of contacts on die-to-die subsystem 100, corresponds to a given contact on die-to-die subsystem 200, having the same spatial relationship within the array of contacts on die-to-die subsystem 200.

Also, each bit of data traverses a physical on-die path from its respective sequential logic circuit (in this case, a parallel output driver) and driver to its electrical contact. On-die physical data path 111 in this example is a metal trace connecting electrical contact 101 to ESD circuitry 126, data driver 121, output driver register 131, and data inputs d_in<4> and d_in<5>. Similarly, on-die physical data path 211 connects electrical contact 201 with output driver register 231 on die-to-die subsystem 200. Each of the electrical contacts on die-to-die subsystem 100 and 200 includes a corresponding physical on-die data path, such as on-die data path 113 serving electrical contact 103, and on-die data path 213 serving electrical contact 203.

Further in this example, the I/O circuitry and ESD circuitry associated with the electrical contacts of die-to-die subsystems 100 and 200 are located in I/O circuitry areas 195 and 295. In the example of die-to-die subsystem 100, the I/O circuitry area 195 is shown on a left-hand side of the die next to electrical contact area 190. Similarly, in the die-to-die subsystem 200, the I/O circuitry area 295 is shown on a right-hand side of the electrical contact area 290. In the examples of FIGS. 1 and 2, I/O circuitry area 195 does not overlap with electrical contact area 190, and I/O circuitry area 295 does not overlap with electrical contact area 290. In the top-down view of FIG. 1, I/O circuitry area 195 is laterally separated from electrical contact area 190, and a similar arrangement is shown in FIG. 2 with respect to I/O circuitry area 295 and electrical contact area 290. Thus, in contrast to a system in which I/O circuitry and ESD circuitry are located under, or very near, their electrical contacts, the illustrated embodiment of FIGS. 1 and 2 places those I/O circuits and ESD circuits in a separate area laterally spaced apart from an area that includes the electrical contacts.

The clock input is illustrated as clk_in in FIG. 1, and the clock is distributed to the output driver registers by transmit clock tree 150. In FIG. 2, receive clock tree 250 distributes the clock to the sequential logic circuits (for example, output driver register 231). In this example, clock trees 150 and 250 include metal traces or routes that are physically disposed on the die in the pattern shown in FIGS. 1 and 2. On die-to-die subsystem 100, clock tree 150 provides a clock signal to clock contact 155 via on-die physical path 156, which is similar to the on-die data paths discussed above. At die-to-die subsystem 200, clock contact 255 provides the clock signal to clock tree 250 via on-die physical path 256.

In some examples, the sequential logic circuits and the metal traces that form the clock trees 150 and 250 are much smaller than the electrical contacts, so that they do not extend as far in the Y dimension as do the respective arrays of electrical contacts in areas 190, 290. In other words, the size of the clock tree, output driver registers, drivers, and ESD circuits within areas 195 and 295 may not be drawn to scale with respect to the sizes of the electrical contacts in areas 190, 290. Nevertheless, such embodiments still conform to the concepts described above, where the sequential logic circuits and clock trees are disposed on a side of a respective die-to-die subsystem and an array of electrical contacts. Such embodiments also conform to the concepts described above, where the total physical data path lengths traveled by each bit from transmit-side to receive-side are substantially uniform. A notable feature of such embodiments is that the clock trees 150 and 250 are much smaller and less capacitive than if those clock trees had been distributed under their respective electrical contact arrays.

FIGS. 1 and 2 do not show die-to-die data channels, but the matching spatial arrangement of the bits on both die allows the use of die-to-die data channels between corresponding bits that are substantially uniform in length. FIG. 4 shows example die-to-die data channels. Also, a die-to-die clock channel (not shown) that forwards the clock from die-to-die subsystem 100 to die-to-die subsystem 200 is about the same length as the die-to-die data channels so that any delay and channel capacitance attributable by the die-to-die channels to the data bits is also experienced by the clock as it is forwarded from die-to-die subsystem 100 to die-to-die subsystem 200.

As shown above in FIGS. 1 and 2, each die in the multi-die system includes multiple electrical contacts (e.g., 101, 103, 201, 203), which are exposed on a surface of the die. A given electrical contact on die-to-die subsystem 100 corresponds to an electrical contact on die-to-die subsystem 200 to transmit and receive a bit of the parallel data. Each pair of electrical contacts is connected die-to-die by a conductor of length L1, where example die-to-die conductors are shown in FIG. 4.

Focusing on contact 101, which is associated with d_in<4> and d_in<5>, it has a short conductor length of physical path 111 from its register 131 and driver 121. Now moving to die-to-die subsystem 200, the electrical contact 201 is the corresponding contact associated with d_out<4> and d_out<5>. However, contact 201 has a relatively long conductor length of physical path 211 to its register 231. Thus, a relatively short conductor length on die-to-die subsystem 100 for a contact is complemented by a relatively long conductor length on die-to-die subsystem 200 for the corresponding electrical contact (and vice versa). As another illustration, contact 103 of die-to-die subsystem 100 includes a relatively long conductor path 113, which is complemented by a relatively short conductor path 213 of contact 203 at die-to-die subsystem 200.

In this example, the sum of the conductor length on die-to-die subsystem 100 for a contact (contact 101) and the conductor length on die-to-die subsystem 200 for the corresponding contact (201) is referred to as L2 (the sum of the lengths of on-die data channels 111 and 211). For each of the eight pairs of corresponding electrical contacts for data, the above-described relationship holds true—the sum of the conductor lengths is L2. FIG. 4 shows the die-to-die data links 403, and it is understood that they are the same length L1, which may be similar to, or different from, link L2.

In the above example, insertion delay for a clock or data signal is assumed to be proportional to the length of the conductor on which the signal travels. For the system including die-to-die subsystem 100 and die-to-die subsystem 200, each bit of data travels on a path having a length L1+L2 from register at input (e.g., 130) to register at output (e.g., 230); therefore, each data bit travels a same length in the multi-die system and has similar propagation delay.

Also of note is the clocking structure of die-to-die subsystems 100 and 200. At die-to-die subsystem 100, the clock is received at clk_in and then is passed through buffer 152 to on-die data path 156 to electrical contact 155. The clock is transmitted to die-to-die subsystem 200 on a conductor (not shown) of length L1, where it is received at contact 255 also in the third row, sixth column (the same spatial position as contact 155). On die-to-die subsystem 200, the clock signal is passed from contact 255 to buffer 252. Once again, the sum of the conductor lengths on die-to-die subsystem 100 and die-to-die subsystem 200 is L2, so that that total travel for the clock signal from die-to-die subsystem 100 to die-to-die subsystem 200 is L1+L2. Thus, the clock signal travels on a path of a same length as that of the data paths and has a propagation delay the same as that experienced by the data bits. A design feature of the embodiment of FIGS. 1 and 2 is that a sum of L1 and L2 is substantially the same for each of the data bits and for the clock. However, there may be very small differences in L1 among the bits and in L2 among the bits that result from the layouts of the metal traces, where the small differences do not affect setup and hold time considerations. The example of FIGS. 1 and 2 use a differential clock (CLK and CLKB), and while the example above refers to one of the clock signals clk_in, it is understood that the same principle applies just as well to the inverse of that signal.

The spatial array of electrical contacts on die-to-die subsystem 100 is the same as the spatial array of electrical contacts on die-to-die subsystem 200. In the present example, die-to-die subsystem 100 includes its clock tree 150, I/O circuitry, and ESD circuitry on a left-hand side of the array of electrical contacts, and die-to-die subsystem 200 includes its clock tree 250, I/O circuitry, and ESD circuitry on a right-hand side of its array of electrical contacts. Die-to-die subsystem 100 and die-to-die subsystem 200 share a right-hand versus left-hand relationship of their respective clock trees and registers, thereby providing complementary lengths for on-die data channels.

An operating example focusing on the data bits and clock signals is instructive. In this example, the clock signal is received at clk_in at die-to-die subsystem 100. The clock signal is passed through buffer 152 and onto clock tree 150. The clock propagates through the clock tree 150, reaching the closest registers first and the furthest registers last, where proximity of a register to clk_in is defined by the metal length from the clk_in contact to the register. The insertion delay of the clock signal, which is attributable to the clock tree 150, is proportional to the length of the route to that register within clock tree 150. However, in this example, insertion delay attributable to the clock tree 150 is less than an insertion delay attributable to data signal routing because clock tree 150 has been kept relatively small due to the architecture, which confines the registers to area 195.

When a register receives the rising edge of the clock, the register transmits data to a contact over an on-die data route. For example, register 131 receives the clock edge and latches out its data to driver 121, which drives the data signal to electrical contact 101 by way of on-die data route 111. The other registers act similarly in transmitting their data to their corresponding electrical contacts. Electrical contact 101 is in communication with a die-to-die data channel (not shown), which transmits the data to electrical contact 201 on die-to-die subsystem 200. The data signal and then follows on-die data route 211 to register 231, which latches in the data at the received clock edge. Once again, the other electrical contacts operate in a similar manner by transferring their respective data bits on die-to-die data channels, where they are received at electrical contacts on die-to-die subsystem 200 and latched and by receive registers.

Thus in the example above, the data signal traversed on-die data route 111, then die-to-die data channel (not shown), and another on-die data route 211 before being latched at the receive register 231. However, as noted above, the relatively short length of on-die data route 111 is complemented by a relatively long length of on-die data route 211. The sum of the lengths of on-die data route 111 and on-die data route 211 is the same as the sum of the lengths traversed by the other bits at the other electrical contacts. In other words, in this example, each of the data bits traverses substantially the same distance from its transmit register to its receive register. And since signal delay is proportional to conductor lengths, each of the data bits experience substantially the same delay from transmit register to receive register.

The clock signal propagates through buffer 152 and is transmitted to clock contact 155 via on-die route 156 on die-to-die subsystem 100. Clock contact 155 is in communication with a die-to-die clock channel (not shown), which is the same length as each of the die-to-die data channels mentioned above. The clock signal propagates along the die-to-die clock channel and reaches clock contact 255 on die-to-die subsystem 200. The clock signal then propagates via on-die clock channel 256 through ESD protection device 253 and buffer 252 and then to clock tree 250. The clock signal is distributed to the various receive registers (for example, register 231) by clock tree 250.

In this example, clock tree 250 has substantially the same architecture as clock tree 150 of die-to-die subsystem 100. Therefore, an insertion delay experienced at receive register 231, attributable to clock tree 250, is approximately the same as the insertion delay, attributable to clock tree 150, experienced by transmit register 131. Various embodiments use similar architecture for a transmit clock tree (for example, clock tree 150) as for a receive clock tree (for example, clock tree 250) so that clock insertion delay attributable to the clock trees is substantially the same at a given transmit register as it is at its corresponding receive register, thereby ensuring proper setup and hold times.

In this example, the clock signal traverses a path that has substantially the same length as the paths traversed by the data bits. In other words, the sum of the lengths of on-die clock routes 156 and 256 is substantially the same as the sum of the lengths of on-die data routes 111 and 211. In this way, the clock signal experiences substantially the same propagation delay from buffers 152 to buffers 252 as do the various data bits from transmit register to receive register. An adjustable delay element (not shown) may allow for tuning of the propagation delay of the clock signal to provide appropriate setup and hold times.

Of course, the scope of embodiments is not limited to exact identicality of the trees 150 and 250. In other examples, manufacturing process imperfections and variations may affect the metal routes and also affect the insertion delays in insubstantial ways. Thus, trees 150 and 250 are substantially the same with respect to the metal clock routes to the registers, manufacturing process imperfections and variations notwithstanding.

Furthermore, the scope of embodiments is not limited to exact identicality of the lengths of the on-die data and clock routes, as manufacturing process imperfections and slight variations may affect the lengths of the conductors in those data channels. The same is true for die-to-die channels as well. Variations in length that do not affect setup and hold time considerations result in physical paths that are substantially the same for performance purposes in various embodiments.

The example clock trees of FIGS. 1 and 2 include less metal length than does a conventional "H" clock tree. Less metal provides for less capacitance and, thus, less power dissipation. Furthermore, the die-to-die data channels and clock channel may be manufactured to be relatively short in length, especially in scenarios where both the die are designed together. Shorter die-to-die data channels and clock channels also use less metal and provide for less capacitance, power dissipation, and setup and hold time variation.

Additionally, semiconductor area within areas 190 and 290 in the examples of FIGS. 1 and 2 does not host the ESD protection circuits, nor the I/O circuits. Accordingly, that area may be used for other purposes. For instance, the area nearby the electrical contacts or underneath the electrical contacts in areas 190 and 290 may be used for processing circuitry, such as in a CPU or a GPU, or other macros or functional units, memory, and/or the like.

Another advantage of some embodiments is that they may facilitate the design process for different chip packages. In one example, the die of FIGS. 1 and 2 may be used in different chip packages, where each of the chip packages may be associated with a specific pitch for the electrical contacts. The configuration of the above examples allows for the I/O circuitry, clock trees, and ESD circuitry to be placed in areas 195 and 295, whereas the electrical contacts of areas 190 and 290 are physically separate and in fact may be built in the upper metal layers of the respective dies. Since the electrical contacts of areas 190 and 290 are physically separate, both laterally spaced from the other circuitry and built in the upper metal layers, the designs for areas 195 and 295 can be reused for different applications having different electrical contact pitches. In such designs, the contact pitch in the upper metal layers may be changed from application to application as appropriate while retaining the length relationships and timing relationships described above.

Figure 3:
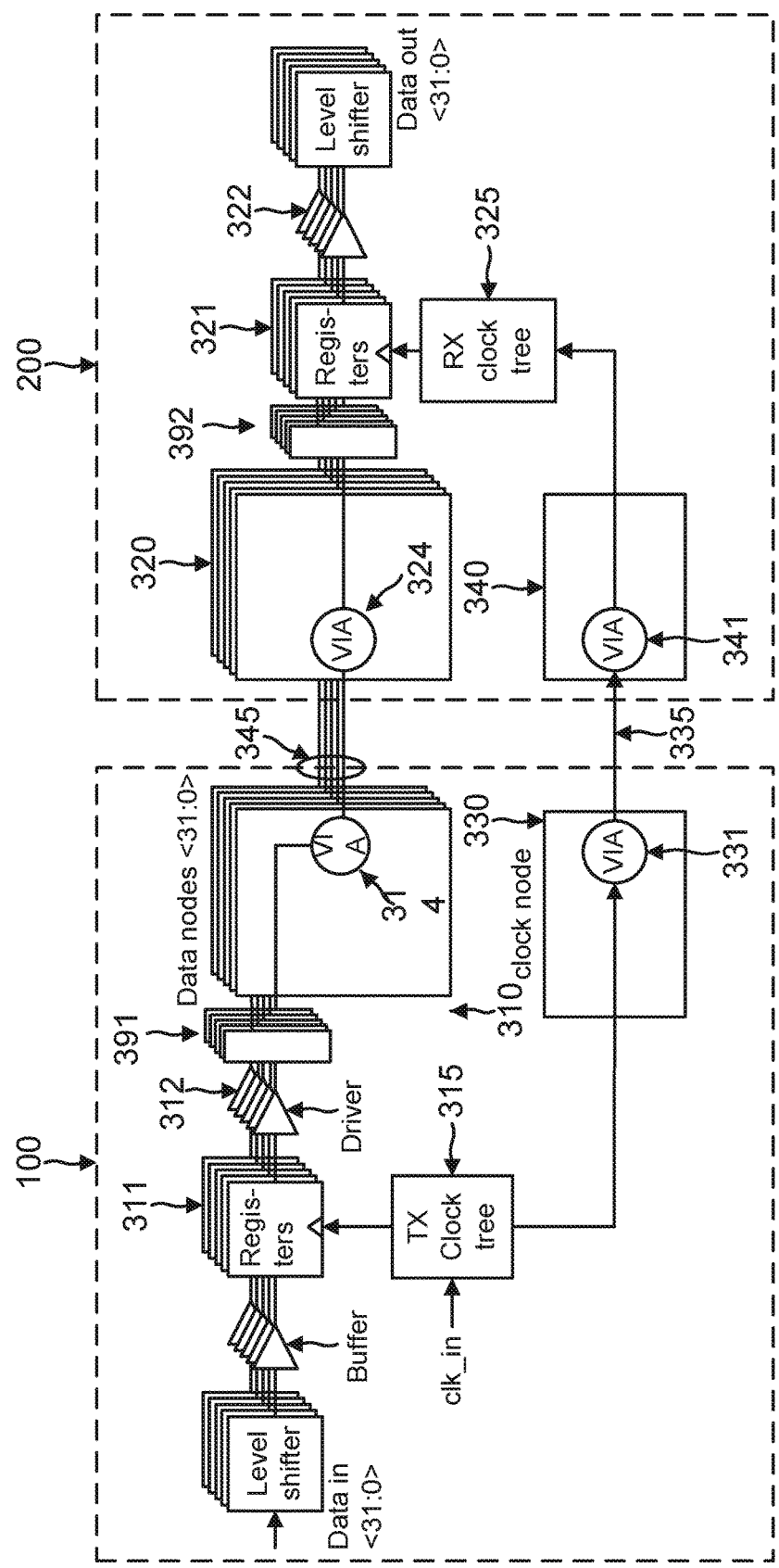
FIG. 3 shows a functional view of an example die-to-die interface, according to one embodiment.

FIG. 3 shows a functional view of an example die-to-die interface, which may be used with die-to-die subsystems 100 and 200 of FIGS. 1 and 2, according to one embodiment of the present disclosure.

Die-to-die subsystem 100 includes data nodes 310 and clock node 330. In this example, data nodes 310 include thirty-two electrical contacts used for data bits (<31:0>). An example of an electrical contact includes via 314, and it is understood that each of the individual data nodes of the group of data nodes 310 may similarly include a via or other appropriate electrical contact structure.

While the example of FIG. 1 discussed 16 data bits, FIG. 3 shows that the scope of embodiments is not limited to any particular number of bits, as the configuration shown in FIG. 1 may be scaled to accommodate other numbers of bits. Furthermore, the data nodes 310 may be arranged to preserve the length and timing relationships discussed above with respect to FIGS. 1 and 2. Each of the thirty-two data nodes are associated with a bit of data in this example, which is somewhat different than the example of FIGS. 1 and 2 in which output driver registers accommodated two bits per electrical contact.

Clock node 330 corresponds to clock contact 155 of FIG. 1, and it includes via 331 as its electrical contact. The data nodes 310 and the clock node 330 of FIG. 3 are another way of illustrating the bits and electrical contacts of a die configured according to the principles of the examples of FIGS. 1 and 2.

Clock node 330 is used to forward the clock from die 1 to die 2, as explained in more detail above. In this example, the clock is in communication with via 331, which is externally-exposed at die 1, and propagates over die-to-die clock route 335 to via 341 at clock node 340. Clock node 340 is another way of illustrating clock contact 255 of FIG. 2.

Die-to-die subsystem 100 includes transmit clock tree 315, which is shown conceptually in FIG. 3, but is understood to correspond to clock tree 150 of FIG. 1. Transmit clock tree 315 includes buffers to receive the clock (from clk_in) and metal routes to registers 311 (of which register 131 is an example). Drivers 312 include as an example driver 121 of FIG. 1. While no specific topological arrangement of the transmit clock tree 315 is shown in FIG. 3, it is understood that tree 315 would have an architecture according to the principles described above with respect to FIGS. 1 and 2.

Similarly, receive clock tree 325 includes buffers to receive the clock from clock node 340 and metal routes to distribute the clock to registers 321 (of which register 231 is an example). Data nodes 320 have thirty-two electrical contacts in this embodiment, of which contact 201 is an example. Via 324 is an example of an electrical contact included within the nodes 320, and via 341 is an electrical contact at clock node 340. Each of the nodes corresponds to one of the nodes of data nodes 310. Consistent with the examples of FIGS. 1 and 2, data nodes 310 and 320 are arranged in a spatial pattern such that a pair of corresponding nodes (one a transmit node and one a receive node) are similarly placed upon their respective die. Thus, each of the thirty-two data forwarding channels 345 are uniform in length (and match a length of clock forwarding route 335).

Returning to die-to-die subsystem 100, the clock is distributed by transmit clock tree 315 to the registers 311. Each data node 310 in this example is in communication with one of the registers 311, which are storing data. When a given register 311 receives the clock edge it forwards the data to its respective data node and via 314. The data is then transported on a respective data forwarding route 345 to its corresponding node within data nodes 320. The data is received by a respective via 324 and is captured by its respective register 321 at the clock edge. This process is the same as that described above with respect to FIGS. 1 and 2.

Subsystem 100 includes ESD protection circuits 391, and subsystem 200 includes ESD protection circuits 392. As shown in the examples of FIGS. 1 and 2, the ESD protection circuits, I/O circuits, and clock trees may be arranged within an area physically separate from, and not overlapping, areas of the respective dies where the electrical contacts (e.g., vias 314, 324) are located. Such arrangement is not specifically illustrated FIG. 3, though it is understood that the components shown in FIG. 3 may be physically configured as described above in the examples of FIGS. 1 and 2, including separating the electrical contact area from the I/O circuits, ESD protection circuits, clock trees.

The examples of FIGS. 1-3 above are provided for illustrative purposes, and it is understood that the scope of embodiments is not limited to the specific embodiments shown above. For instance, die may be adapted to serve any appropriate number of nodes (whether thirty-two, fifty, or another number). Furthermore, while FIG. 3 shows registers, any appropriate sequential logic circuit, such as flip-flops, may be used in various embodiments.

The die referred to above (and including the die-to-die subsystems) of FIGS. 1-3 may be included in a multi-die system. FIG. 4 shows one example multi-die system adapted according to one embodiment. FIG. 4 shows a top down view of multi-die package 400. Multi-die package 400 may include a physical unit that encompasses Die 1 and Die 2. For example, multi-die package 400 may be implemented using an interposer (not shown), or may be implemented as a multitude of metal layers and dielectric layers that are grown over Die 1 and Die 2, or any other appropriate way. FIG. 4 is offered to show that two or more die may be physically included within a common multi-die package, and individual ones of those die may conform to the configuration described above with respect to FIG. 1 and FIG. 2. For instance, Die 1 includes electrical contact area 490 and an area 495 that includes I/O circuitry, ESD protection circuitry, and a clock tree. The electrical contacts 401 are shown as vias. Similarly, Die 2 includes electrical contact area 491 and an area 496 that includes I/O circuitry, ESD protection circuitry, and a clock tree. The electrical contacts 402 are shown as vias. As described above, the lengths of the die-to-die links 403 are substantially uniform to ensure similar insertion delays for data bits.

Die 1 and Die 2 each include a three-by-three array of electrical contacts spatially placed so that similarly positioned contacts on each die correspond to each other. For example, contact 401a corresponds to contact 402a, contact 401b corresponds to contact 402b, and contact 401c corresponds to contact 402c. The other six contact on each die correspond similarly.

Contacts 401a and 402a are in communication through data channel 403a, contacts 401b and 402b are in communication through data channel 403b, and contacts 401c and 402c are in communication through data channel 403c. The other six corresponding pairs are also in communication similarly. Of note is that each of the data channels 403a-c, and the other unlabeled data channels, are uniform in length. Thus, each corresponding pair of contacts has substantially the same delay in communicating information from die 1 to die 2. Although not shown in FIG. 4, it is understood that a clock channel may also be used that is substantially the same length as the data channels. The scope of embodiments is not limited to any particular number of contacts on a die or number of corresponding pairs, as the three-by-three array of FIG. 4 is an example.

Although not shown in FIG. 4, it is understood that a clock channel may also be used that is substantially the same length as the data channels. The scope of embodiments is not limited to any particular number of contacts on a die or number of corresponding pairs, as the three-by-three array of FIG. 4 is an example.

Figure 5:
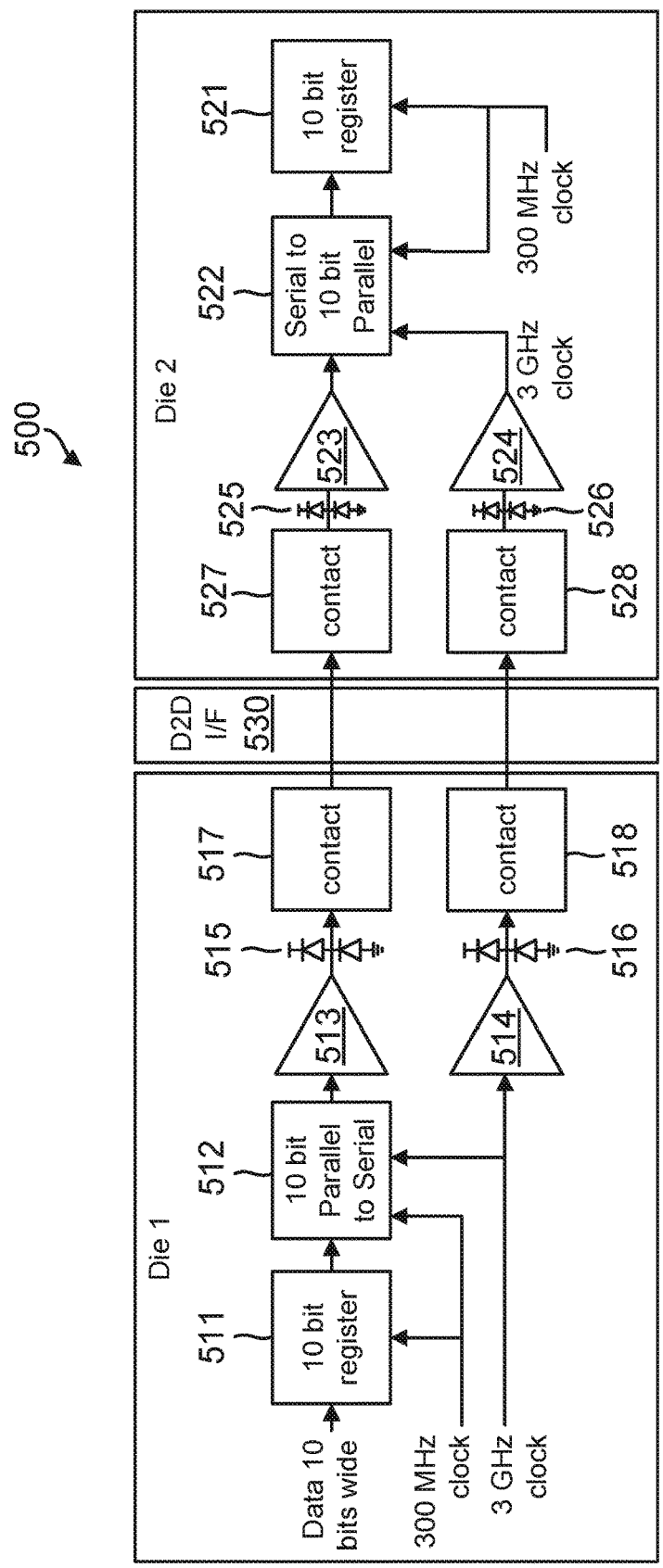
FIG. 5 is an illustration of example serializer and deserializer circuitry, adapted according to one embodiment.

FIG. 5 is an illustration of serializer and deserializer circuitry 500, which may be used in some embodiments to reduce a number of electrical contacts. In the example of FIG. 5, Die 1 is transmitting data bits to Die 2. Die 1 receives 10 parallel bits at 10 bit register 511, clocked in at 300 MHz. Register 511 clocks the bits out at 300 MHz to 10 bit parallel-to-serial circuit 512. Parallel-to-serial circuit 512 receives the 300 MHz clock to the input the parallel bits, and it outputs the bits according to a 3 GHz clock. The parallel-to-serial circuit 512 outputs the bits serially to driver 513, ESD protection circuit 515, to electrical contact 517. Similarly, the 3 GHz clock is output by driver 514 to ESD protection circuit 516 and to contact 518. In this example, the bits are transmitted serially, so they use one physical electrical contact 517.

Both the clocks and the data bits traverse the die-to-die links 530. The data bits are received at electrical contact 527, and the 3 GHz clock is received at electrical contact 528. The data bits are conducted from electrical contact 527 to ESD protection circuit 525, to driver 523, and on to serial-to-parallel circuit 522. Serial-to-parallel circuit 522 receives the data bits according to the 3 GHz clock and outputs 10 bits in parallel to the 10 bit register according to the 300 MHz clock. The 300 GHz clock is conducted from the electrical contact 528, to the ESD protection circuit 526, to the driver 524, and to the serial-to-parallel circuit 522. The 10 bit register operates according to the 300 MHz clock and stores the bits in parallel.

In some example embodiments, the serial-to-parallel circuitry and parallel-to-serial circuitry of FIG. 5 may be implemented in the areas 195 and 295 of FIGS. 1 and 2 along with the I/O circuitry, the ESD protection circuitry, and the clock trees. An advantage of embodiments including the serial-to-parallel and parallel-to-serial circuitry of FIG. 5 is that the number of electrical contacts may be reduced, thereby further freeing semiconductor space for use by other processing units, memory units, and the like.

Example methods of use for the circuits of FIGS. 1-5 will now be discussed.

Example Methods of Use

Figure 6:
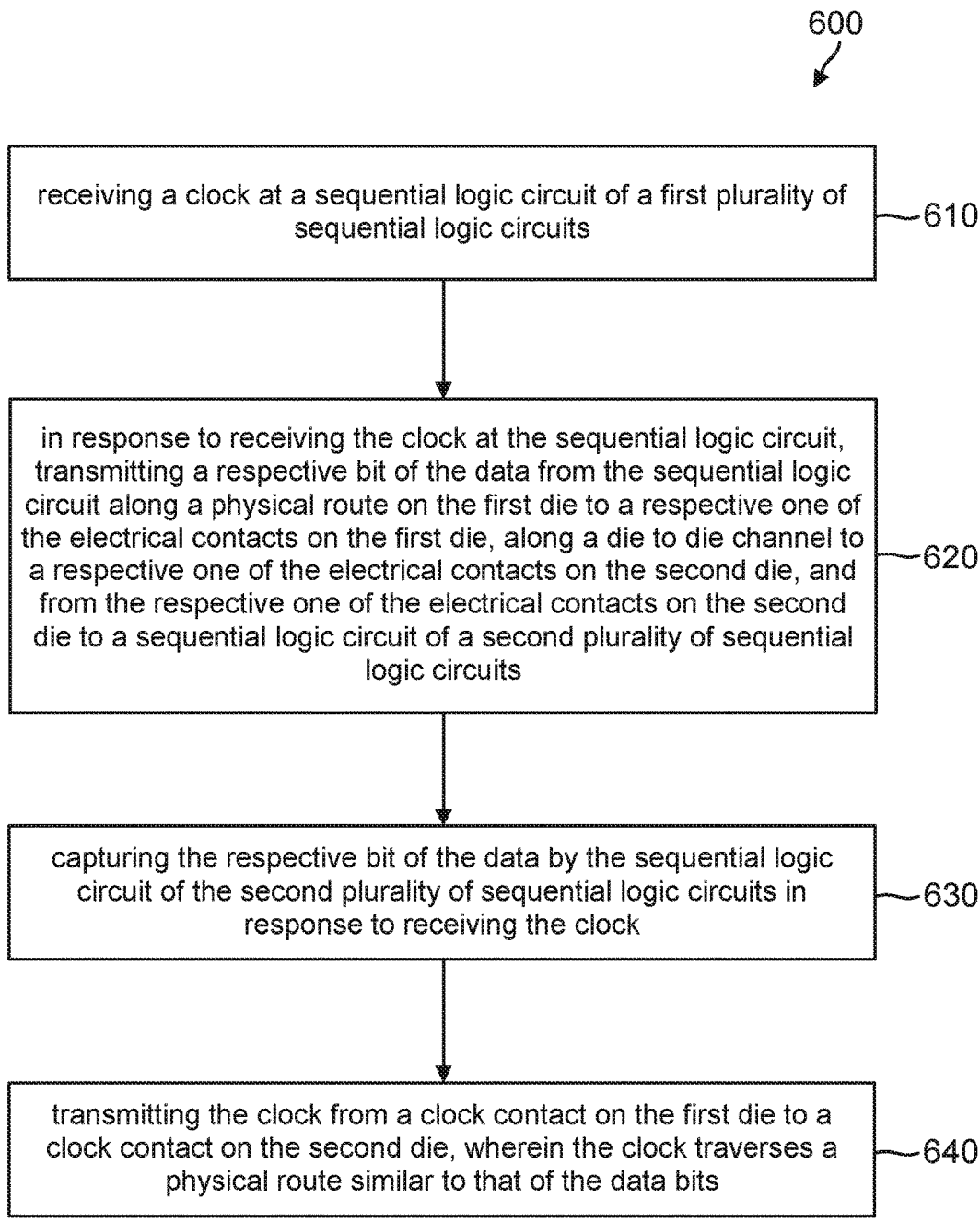
FIG. 6. is a flow diagram for an example method of distributing clock signals at a die-to-die interface, according to one embodiment.

FIG. 6 is a flow diagram for an example method 600 of providing data and clock signals at a die-to-die interface, according to one embodiment. The method 600 may be performed by the circuits illustrated in FIGS. 1-5. In the example method 600, the actions are performed with respect to the circuit layout shown in FIGS. 1 and 2. Specifically, each die-to-die subsystem includes an array of electrical contacts, at least one clock contact, and each of the die-to-die subsystems arranges its electrical contacts in the array in the same way. One die places its clock tree, I/O circuitry, and ESD circuitry in an I/O circuitry area and places its array of electrical contacts in an electrical contact area separate from the I/O circuitry area. The other die places its clock tree, I/O circuitry, and ESD circuitry in its I/O circuitry area that is separate from its electrical contact area. In the example of FIGS. 1 and 2, the two die may use a right-hand versus left-hand relationship for placement of the I/O circuitry areas 195 and 295.

Thus, consistent with FIGS. 1 and 2, a corresponding pair of electrical contacts includes a transmit contact and a receive contact that handle the same bit of data from die-to-die. Both the transmit contact and the receive contact are positioned spatially within their respective arrays substantially the same.

Furthermore, for each bit of data an on-die data route for the first die has a length that is complemented by the length of an on-die data route for the second die. A relatively long length for an on-die data route is complemented by a relatively short length for an on-die data route on the other die. A sum of on-die data routes for a given bit for both of the die is substantially equal for each of the bits. As a result, propagation delay attributed to the on-die data routes should be substantially the same for each of the bits as well. A clock path includes on-die clock routes that sum to be approximately the same as that of the data routes.

A data bit input receives data bits on the first die and passes the data bits to sequential logic circuits, for example registers, on the first die. The actions described below at blocks 610-640 are performed for each one of the bits of data.

The method begins at block 610, which includes receiving the clock at a sequential logic circuit of the first die. Each of the bits is associated with a respective sequential logic circuit, and each of the sequential logic circuits receive the clock. In the example of FIGS. 1 and 2, the registers each handle two input bits and two output bits, though the scope of embodiments may include one bit per register or more than two bits per register.

At block 620, the sequential logic circuit, in response to receiving the clock, transmits its bit of data along a physical route on the first die to a respective one of the electrical contacts on the first die, along a die-to-die channel to an electrical contact on the second die, and from the electrical contact on the second die to a sequential logic circuit of the second die. In some embodiments, each bit traverses a uniform length sum for the on-die physical routes, and the die-to-die data channels are substantially uniform in length as well.

At block 630, in response to receiving the clock the sequential logic circuit of the second die captures the bit of the data. The actions of blocks 610-640 are exemplified by the circuits of FIGS. 1 and 2 as the data bits are forwarded from the transmit I/O circuitry over physical data paths, including on-die and die-to-die paths, to receive I/O circuitry on the other die. As noted above, the physical data paths are similar for each bit of data, and thus each bit of data experiences a similar propagation delay.

At block 640, the clock is transmitted from a clock contact on the first die to a clock contact on the second die. The clock signal traverses a physical route similar to that traversed by each of the data bits.

In the examples of FIGS. 1 and 2, the clock is received at the transmit (first) clock tree and then is forwarded to the receive (second) clock tree over a clock forwarding channel Thus, the clock at the receive clock tree arrives after a short delay that is additive to any insertion delay at the receive tree itself. In some embodiments, corresponding sequential logic circuits on each of the die (e.g., a transmit register and a receive register handling the same bit of data) experience a same clock-tree-attributable insertion delay, so that the delays attributable to the clock trees are canceled out.

The scope of embodiments is not limited to the specific method shown in FIG. 6. Other embodiments may add, omit, rearrange, or modify one or more actions. For instance, the actions of block 640, in which the clock is transmitted from die-to-die, is performed as the data bits are transmitted from die-to-die. In other words the arrangement of blocks in method 600 is not limited to a specific order of actions. Also, some embodiments may include serializing the data bits at the transmit side before the data bits are passed to a transmit electrical contact and further deserializing the data bits after they are received at a receive electrical contact.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A semiconductor die comprising:
   a die-to-die interface including an input/output (I/O) circuitry area and an electrical contact area;
   wherein the electrical contact area includes an array of electrical contacts disposed on a side of the semiconductor die; and
   wherein the I/O circuitry area includes a plurality of drivers, each of the drivers coupled to at least one electrical contact in the electrical contact area, and a plurality of electrostatic discharge (ESD) protection devices, each of the ESD protection devices coupled to a respective driver, further wherein the I/O circuitry area and the electrical contact area are separated in a top-down view of the semiconductor die.

2. The semiconductor die of claim 1, wherein the I/O circuitry area further includes a plurality of data registers, each of the data registers being associated with at least one of the drivers.

3. The semiconductor die of claim 2, wherein the I/O circuitry area further includes a clock tree coupled to the plurality of data registers.

4. The semiconductor die of claim 2, wherein each of the registers is coupled with a plurality of data bit inputs.

5. The semiconductor die of claim 1, wherein a first one of the electrical contacts is coupled to a serializer circuit, wherein the serializer circuit is coupled to a plurality of data bit inputs and is configured to output serial data to the first one of electrical contacts.

6. The semiconductor die of claim 1, wherein a first one of the electrical contacts is coupled to a deserializer circuit, wherein the deserializer circuit is coupled to a plurality of data bit outputs and is configured to receive serial data from the first one of the electrical contacts.

7. The semiconductor die of claim 1, further comprising:
a plurality of data bit inputs, each of the data bit inputs being coupled to one of a plurality of data registers, wherein each of the data bit inputs is associated with a respective bit of data, further wherein a path for a given bit of data comprises:
a physical route from a respective data input to one of the data registers, one of the drivers, one of the ESD protection devices, and one of the electrical contacts.

8. The semiconductor die of claim 1, wherein physical electrical paths between the drivers and the electrical contacts include metal layers of the semiconductor die formed above the drivers.

9. The semiconductor die of claim 1, wherein the I/O circuitry area and the electrical contact area are laterally spaced apart and non-overlapping.

10. A multi-chip system comprising:
a first semiconductor die having a first array of electrical contacts; and
a second semiconductor die having a second array of electrical contacts, wherein a given electrical contact of the first array is coupled to a respective electrical contact of the second array;
wherein the first semiconductor die further includes: a plurality of data drivers and a plurality of electrostatic discharge (ESD) protection devices, wherein each of the data drivers is coupled to a respective one of the ESD protection devices, further wherein each of the ESD protection devices is coupled to a respective one of the electrical contacts of the first array, wherein in a top-down arrangement of the first semiconductor die, the plurality of data drivers and the plurality of ESD protection devices are disposed within a first area of the semiconductor die and the first array of electrical contacts is disposed within a second area of the semiconductor die, the first area and second area being non-overlapping and laterally spaced apart in the top-down arrangement.

11. The multi-chip system of claim 10, wherein the first semiconductor die further comprises:
plurality of data registers within the first area, each of the data registers being associated with at least one of the data drivers.

12. The multi-chip system of claim 11, wherein the first semiconductor die further comprises:
a clock tree in the first area and coupled to the plurality of data registers.

13. The multi-chip system of claim 12, wherein the clock tree is in contact with an exposed clock node on the first semiconductor die, the exposed clock node on the first semiconductor die coupled to a die-to-die clock channel in communication with an exposed clock node on the second semiconductor die, further wherein the exposed clock node on the second semiconductor die is in communication with an additional clock tree on the second semiconductor die.

14. The multi-chip system of claim 10, wherein a first electrical contact of the first array of electrical contacts is coupled to a serializer circuit, wherein the serializer circuit is coupled to a plurality of data bit inputs and is configured to output serial data to the first electrical contact of the first array of electrical contacts.

15. The multi-chip system of claim 14, wherein a first electrical contact of the second array of electrical contacts is coupled to a deserializer circuit, wherein the deserializer circuit is coupled to a plurality of data bit outputs of the second semiconductor die and is configured to receive serial data from the first electrical contact of the second array of electrical contacts.

16. The multi-chip system of claim 10, further comprising:
a plurality of data bit inputs of the first semiconductor die, each of the data bit inputs being coupled to one of a plurality of data registers of the first semiconductor die, wherein each of the data bit inputs is associated with a respective bit of data, further wherein a path for a given bit of data comprises:
a physical route from a respective data input to one of the data registers, one of the data drivers, one of the ESD protection devices, and one of the electrical contacts of the first array of electrical contacts to one of the electrical contacts of the second array of electrical contacts through a data channel between the first semiconductor die and the second semiconductor die.

17. A semiconductor die comprising:
a die-to-die interface including an input/output (I/O) circuitry area and an electrical contact area;
wherein the electrical contact area includes an array of electrical contacts disposed on a side of the semiconductor die; and
wherein the I/O circuitry area includes a plurality of means for driving data bits, each of the driving means being coupled to at least one electrical contact in the electrical contact area, and a plurality of means for protecting against electrostatic discharge (ESD), each of the means for protecting against ESD being coupled to a respective driving means, further wherein the I/O circuitry area and the electrical contact area are separated in a top-down view of the semiconductor die.

18. The semiconductor die of claim 17, further comprising:
means for distributing clock signals to sequential logic circuits in the I/O circuitry area.

19. The semiconductor die of claim 17, further comprising:
a plurality of physical data channels coupling respective ones of the electrical contacts in the electrical contact area to electrical contacts on an additional semiconductor die.

20. The semiconductor die of claim 17, further comprising:
means for serializing a plurality of data bits and outputting serialized data bits to a first one of the electrical contacts.

21. The semiconductor die of claim 17, further comprising:
means for deserializing a plurality of data bits received from a first one of the electrical contacts, wherein an output of the deserializing means is coupled to one of the driving means.

22. The semiconductor die of claim 17, wherein the I/O circuitry area and the electrical contact area are laterally spaced apart and non-overlapping.

23. A method comprising:
providing data bits from a plurality of electrical contacts on a first die to a plurality of electrical contacts on a second die, wherein individual ones of the plurality of electrical contacts on the first die correspond to respective ones of the electrical contacts on the second die, wherein the electrical contacts are disposed within a first area of a surface of the first die;

for each one of the data bits:
receiving a clock signal at a sequential logic circuit of a first plurality of sequential logic circuits arranged within a second area of the first die, wherein the second area is non-overlapping and laterally spaced apart from the first area in a top-down view of the first die;

in response to receiving the clock signal at the sequential logic circuit, transmitting a respective bit of the data from the sequential logic circuit along a physical route on the first die to a respective one of the electrical contacts on the first die by way of a data driver and an electrostatic discharge (ESD) protection circuit within the second area, along a die-to-die channel to a respective one of the electrical contacts on the second die, and from the respective one of the electrical contacts on the second die to a sequential logic circuit of a second plurality of sequential logic circuits on the second die; and capturing the respective bit of the data by the sequential logic circuit of the second plurality of sequential logic circuits in response to receiving the clock signal.

24. The method of claim 23, wherein the plurality of electrical contacts on the first die comprise vias exposed at the surface of the first die.

25. The method of claim 23, wherein the plurality of sequential logic circuits comprise data registers.

* * * * *